United States Patent [19]

Hoenninger et al.

[11] Patent Number: 5,490,065
[45] Date of Patent: Feb. 6, 1996

[54] METHOD AND APPARATUS FOR TESTING AUTOMOTIVE CONTROL UNITS

[75] Inventors: Harald Hoenninger, Freiburg; Michael Horbelt, Bietigheim; Arno Pruellage, Schwieberdingen; Hans Seitel, Ostfildern, all of Germany

[73] Assignee: Robert Bosch GmbH, Stuttgart, Germany

[21] Appl. No.: 234,677

[22] Filed: May 2, 1994

Related U.S. Application Data

[63] Continuation of Ser. No. 884,699, May 18, 1992, abandoned.

[30] Foreign Application Priority Data

Jun. 29, 1991 [DE] Germany .................. 41 21 637.7

[51] Int. Cl.⁶ .................................................. G06F 17/00
[52] U.S. Cl. .............................. 364/424.03; 364/424.04
[58] Field of Search ....................... 364/424.04, 442, 364/151, 424.03; 73/114, 113

[56] References Cited

U.S. PATENT DOCUMENTS

| | | | |
|---|---|---|---|
| 4,339,801 | 7/1982 | Hosaka et al. | 364/431.04 |
| 4,839,812 | 6/1989 | Nusser et al. | 364/442 |
| 4,845,630 | 7/1989 | Stephens | 364/442 |
| 5,003,476 | 3/1991 | Abe | 364/424.04 |

FOREIGN PATENT DOCUMENTS

| | | |
|---|---|---|
| 3904891A1 | 8/1989 | Germany. |
| 2212638 | 7/1989 | United Kingdom. |
| 2244161 | 11/1991 | United Kingdom. |

Primary Examiner—Kevin J. Teska
Assistant Examiner—Stephen J. Walder, Jr.
Attorney, Agent, or Firm—Frishauf, Holtz, Goodman, Langer & Chick

[57] ABSTRACT

A method and a device for testing control units are presented, serving the purpose of operation and quality testing of automotive control units. The method comprises event control of individual test steps with defined signals from and to the test unit, thus reducing the test time. The method, furthermore, encompasses a test with square wave signals applied to the control unit, which are recognized by the control unit and read out to the test unit, thus increasing the depth of the test.

15 Claims, 4 Drawing Sheets

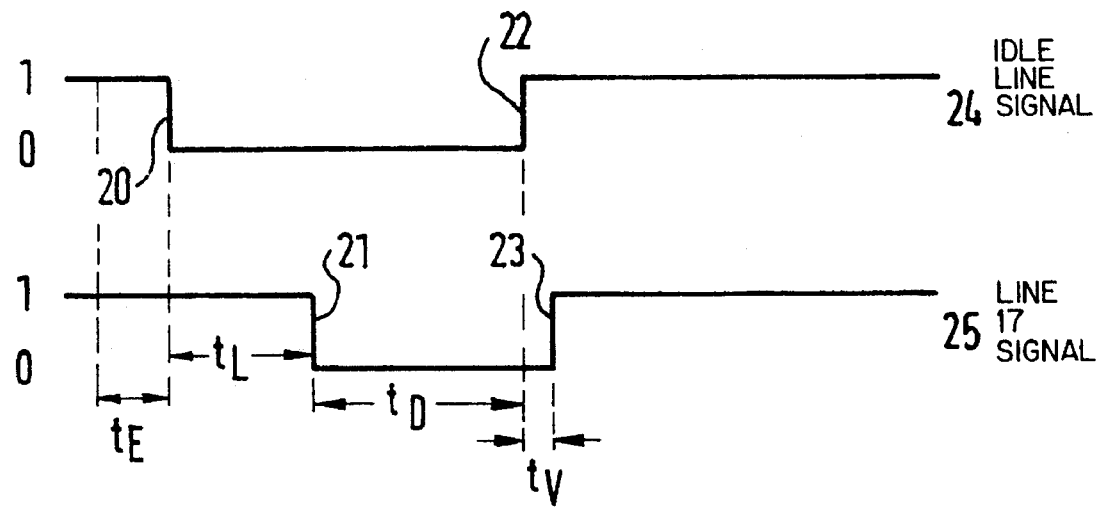
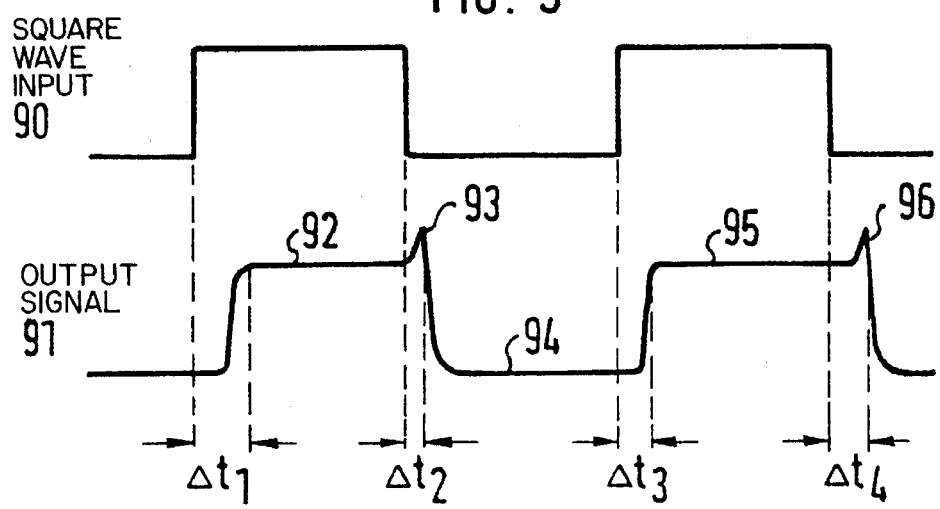

1

METHOD AND APPARATUS FOR TESTING AUTOMOTIVE CONTROL UNITS

This application is a continuation of application Ser. No. 07/884,699, filed May 18, 1992 now abandoned.

FIELD OF THE INVENTION

The invention relates generally to a method for testing control units and to an apparatus for carrying out the method.

BACKGROUND

One method for testing electrical circuits is already known from German Patent Disclosure Document DE-OS 36 32 569 and the corresponding U.S. Pat. No. 4,839,812, NUSSER et al. Therein, the individual inputs and outputs of the control unit are tested separately in individual test steps. This is accomplished with a simulation and measuring unit, which provides specific signals to the inputs of the control unit. These signals are then retrieved by a test program stored in the memory of the control unit. Controlled by the test computer connected to the simulation and measuring unit, the data determined by the test program are then transferred to this test computer and checked for accuracy. If necessary, the test computer initiates an error message. The test computer also applies certain data to the control unit via the interface and commands the control unit to transfer these data to certain outputs. With the measuring instruments, contained in the simulation and measuring unit, the test computer checks these data for accuracy. If the values are not within a predetermined command value range, the test computer will initiate an error message.

Application of this test method is very time-consuming because the individual inputs and outputs have to be tested separately and a certain waiting period has to elapse before processing a test step by the test program. During this time, the test computer can apply other data to the inputs.

THE INVENTION

The advantage of the method, according to this invention, on the other hand, is that processing of the test steps is event-controlled. This results in a reduction of the testing time, which is advantageous to the production of the control units. A dynamic measurement of input signals, like transient effects by varying the time period between the time the signal is applied to the control unit and the time the signal controlling the processing of the applied signals, is also possible.

Another advantage is the possibility of testing several inputs and/or outputs simultaneously. This also results in a reduction of the test period. Except for the input reserved for the event-control, test signals can be applied to all other inputs. Varying numbers of inputs and/or outputs can be tested in one test step. The method is thus very adaptable. The number of test steps can be varied also and is only limited by the size of the volatile memory in the control unit. Another advantage can be seen in the fact that processing of the test signals applied to the control unit is done independent of the operational program of the control unit. The method can thus be made compatible with differing control units. Only the nominal values need to be adapted to the potentially different set-up. If only the data and/or programs of the control unit need to be altered, no adaptation of the test unit is necessary.

Selection of the actual measured values, applied to the control unit, is no longer limited to the value range of the input and output data—as determined by the operational program—and can be adapted for the testing guidelines to the requirements of the control unit set-up. It is further possible to determine and utilize the input data derived from the physical condition of the control unit for the control unit program directly.

A further advantage is that the time behavior of certain alternating signals applied to the control unit and immediately read out by the control unit, especially square waves, can be measured and evaluated. This results in an increase of the test depth. It also enables the recognition of power-down surges and voltage saturations of the signals being read out. The assignment of the alternating signals applied to the input terminals to specific output terminals is not predetermined but may partially be selected by the user.

It is advantageous to apply at least one signal not occurring during normal operation to certain input terminals of the control unit and have the test program process it, check its validity and terminate the test program upon recognition of it's incorrectness. This makes entering of the test program by mistake more difficult. An even better method to prevent entering the test program is to initialize the control unit upon the start of the test. The test program stores certain data in a free memory field of the control unit and/or certain registers of the control unit. During the course of the program, the test program checks the contents of this memory field and/or register for accuracy and terminates the test program if the data in the memory field and/or register are determined to be inaccurate.

For the operation of the method, a test unit is devised that uses an existing simulation and measuring unit. The simulation portion of the simulation and measuring unit contains resistance network switches and signal generators that are used to apply different data to the input terminals of the control unit and, via controllable relays, to the different inputs. Measuring instruments used may be digital voltmeters, oscilloscopes, transient memories, and frequency counters. To convert analog inputs and for the output of analog signals, it is advisable to equip the input and output circuits of the control unit and of the simulation and measuring unit with analog-to-digital and digital-to-analog converters. For manual initiation of individual test steps, it is advisable to equip the simulation and measuring unit with a manual control device.

DRAWINGS

Further features of the preferred embodiment will be apparent from the drawings, of which:

FIG. 4 shows a signal diagram of two control lines for the process control of the test; and FIG. 5 shows a signal diagram of two test lines of the device for testing the control unit with square wave signals.

DETAILED DESCRIPTION

Figure 1:
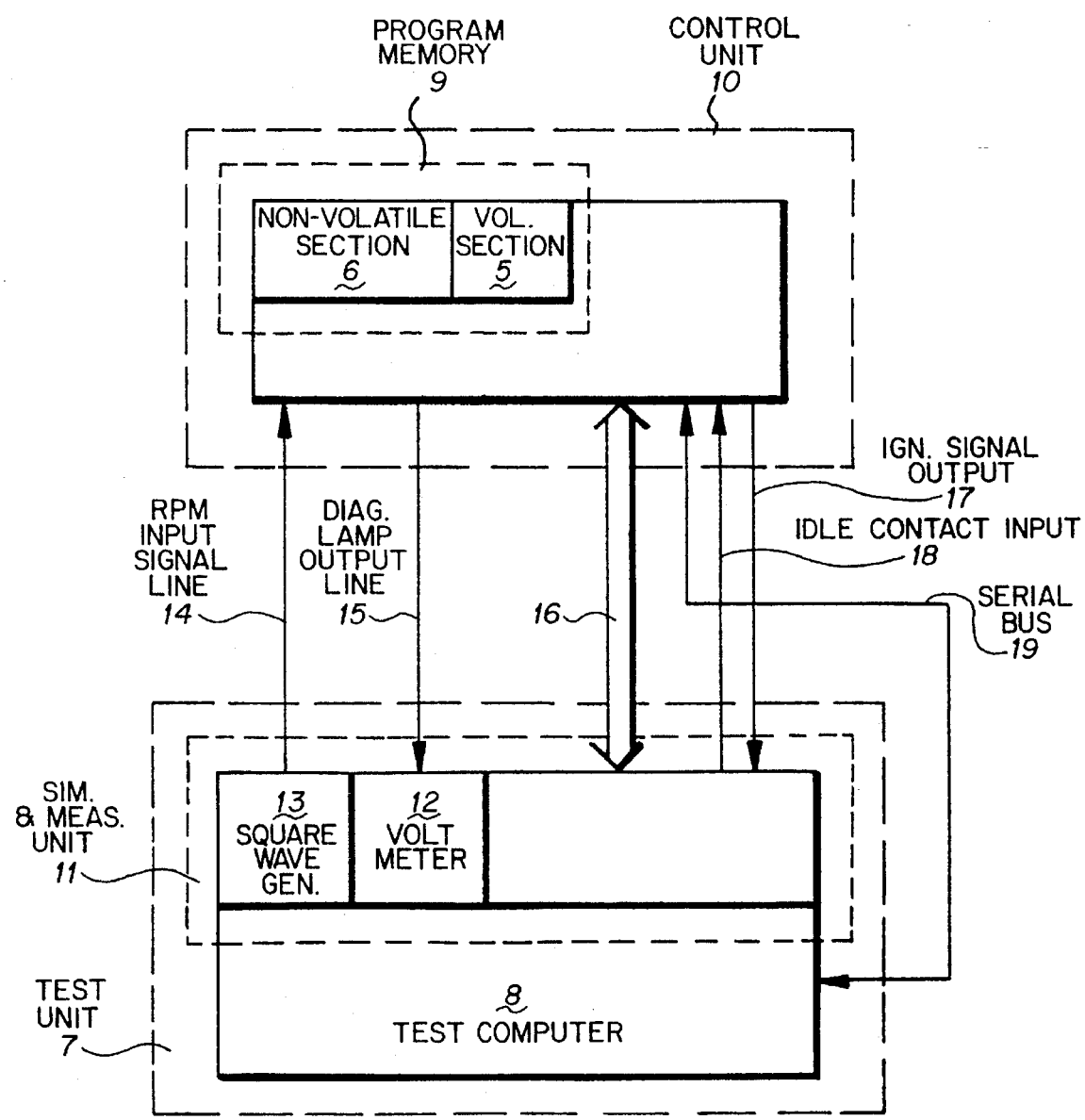
FIG. 1 is a schematic diagram of a control unit, e.g. an automotive ignition control unit, temporarily connected to a test unit in accordance with the present invention.

The system for testing control units, shown in FIG. 1, includes a test unit 7 and a control unit 10. The test unit 7 includes a test computer 8 and a simulation and measuring unit 11. The simulation and measuring unit 11 includes a digital voltmeter 12, a square wave generator 13, and other measuring instruments, like frequency counters and oscilloscopes. The test unit 10 contains a program memory 9 with a volatile section 5 and a non-volatile section 6. From the square wave generator 13, a line 14, in normal operation used as RPM input signal line, leads to the control unit 10. From the control unit 10 another line 15, in normal operation used as diagnosis lamp output signal line, leads to the digital voltmeter 12. Other input and output lines 16 are connected to the control unit 10 and the simulation and measuring unit 11.

A serial bus 19 is connected to the control unit 10 and the test computer 8 for data transfer to and from the control unit 10. A control signal line 17, in normal operation used as ignition signal output line, leads from the control unit 10 to the simulation and measuring unit 11. From the simulation and measuring unit 11, a control line 18, in normal operation used as idle contact input line, leads to the control unit 10.

OPERATION

Figure 2:
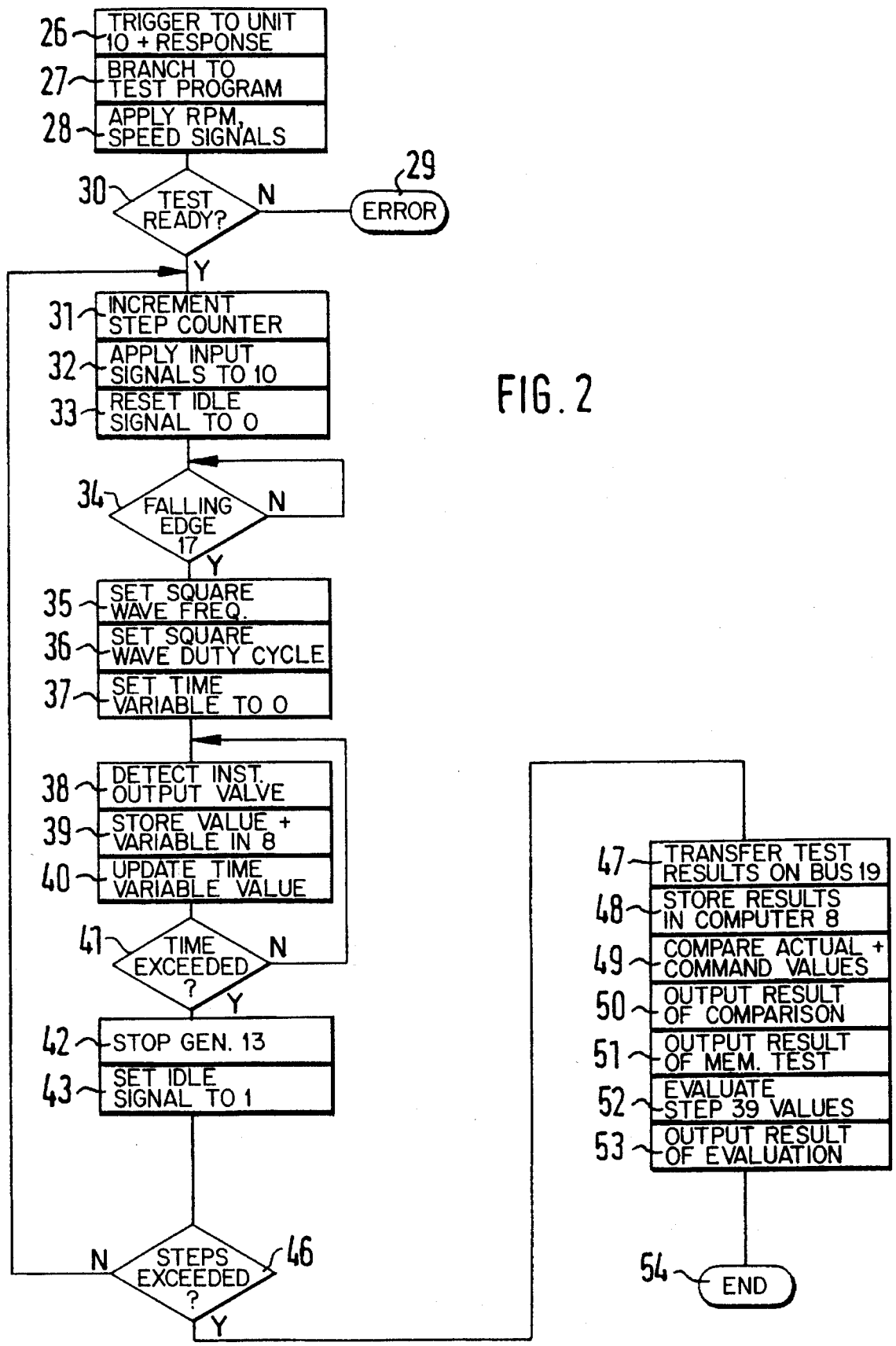
FIG. 2 shows the program structure of the test program stored in the program memory of the test computer.

Operation of the system for testing of the control unit is described in the following, using FIGS. 2 through 5. The structure diagram, shown in FIG. 2, illustrates the process of the test run for the test unit 7. After connecting the control unit 10 with the test unit 7, using the applicable plug-in connectors, and after starting the test program, the test computer 8 initiates communication with control unit 10 via the serial bus 19.

This is accomplished by a trigger with a 5 baud address in test step 26 after which the control unit 10 responds by sending a baud rate recognition byte and other information blocks. At the end of the trigger process, the control unit identification number is transmitted to the test computer. It is used to select the test program with the applicable nominal and measurement values particular to this control unit model. In this stage of the program, a test step counter is set to a specific initial value, e.g., zero. If communication with the control unit 10 cannot be established properly, the control unit is removed for further testing.

If communication has been established successfully, the test computer 8 triggers the control unit 10 in test step 27 to branch off from the operation program and enter the test program in program step 28, a RPM signal with a frequency of 266.6 Hz, corresponding to a motor revolution of 8000 1/min, is applied to the RPM input 14 of the control unit 10, and a speed signal with a frequency of 133.3 Hz, corresponding to half of that motor revolution, is applied to the speed input of the control unit. These signals are selected, because they do not occur during normal operation. Simultaneously, other signals, like a closed idle contact input 18, could be applied to prevent accidental initiation of the test procedure. These inputs are then accessed by the test program of the control unit 10. If the test program recognizes the values themselves as correct and the ratio of revolution to speed as 2, then the control unit 10 responds to the test computer via serial bus 19 indicating test readiness.

Program step 30 shows the request for test readiness. Otherwise, this message does not occur and the test computer terminates the test procedure and an error message occurs (program step 29).

In program step 31, the test step counter is incremented. The first program step is then prepared by test computer 8. This occurs in test step 32. In this step, the test computer 8, using the simulation and measuring unit 11, applies a set of input signals to the input lines of the control unit 10. The set of input signals, corresponding to the test step characterized by the test step counter, is selected from a table. The set of input signals is generated by signal generators contained in the simulation and measuring unit 11.

The set of input signals can be developed in a very variable manner. That is, for instance, a time-independent signal is applied only to one input, while the other inputs are connected to ground. On the other hand, it is also possible to apply time-independent signals to all inputs with no input being connected to ground. Furthermore, the signals do not have to be time-independent, they also may be time-dependent, like a square wave signal of a particular frequency and ratio.

In the subsequent program step 33, the idle contact signal is reset from logic One to logic Zero. This occurs after a certain waiting period, giving the signals time to stabilize. The falling edge on the idle contact signal line signifies to the control unit that the applied input signals are valid. Thereafter, in step 34, the test program repeatedly interrogates or samples the ignition signal output line 17. If the test program recognizes a falling edge signal on the ignition signal output line 17, the test program realizes that the input signals for this test step have been processed by the control unit 10. If this edge signal does not occur after a predetermined time limit, the test program is terminated, and the control unit is removed from the production line.

In the following program steps, 35 and 36, the test computer 8, using the simulation and measuring unit 11, applies square wave signals, with the frequencies and duty cycles predetermined for this particular test step, to specific control unit inputs, likewise predetermined for this test step. These signals are not limited to square wave signals. Other alternating signals, like sawtooth, or triangular shaped signals may be used also.

Thereafter, in program step 37, a time variable is set to zero. In program steps 38 and 39, the instantaneous output value present at the output line predesignated for this test step is registered and stored in the test computer 8, together with the instantaneous value of the time variable.

In the following program step 40, the value of the time variable is increased by an amount corresponding to the already elapsed time. In step 41, a test is made to determine whether or not the time, allocated for the application of the square wave signal for this test step, has already been exceeded. If this is the case, the square wave signal generator 13 is stopped (program step 42) and the idle contact input signal line 18 is set to logic One (program step 43). If this is not the case, program steps 37 through 41 will be repeated.

Step 46 tests or samples the content of the test step counter. If the number of test steps, outlined in the test guidelines, has not been exceeded, program steps 31 through 46 will be repeated.

Otherwise, the program continues with step 47. Therein, the test computer 8 gives a command to the control unit 10, via the serial bus 19, to transfer the processing or calculation results stored in the control unit during the test steps. Thereafter, the data, stored in the memory 9 of the control unit 10 during the test steps, are transferred via the serial bus 19, and stored in the memory of the test computer 8 in program step 48.

In program step 49, the actual measured values of the individual test steps, transferred from the control unit 10, are compared to the command or desired values predetermined for these particular test steps. Program step 50 is to output the result of this comparison.

Program step 51 is to output the result of a test of the memory. Program step 52 is an evaluation of the measurement data and times stored in the memory of the test computer in program step 39. The evaluation procedure is set forth below in more detail, in the description of FIG. 5. Program step 53 is to output the results of this evaluation. In program step 54, test computer 8 ends the test procedure, for example by cutting off the supply voltage at control unit 10.

Figure 3:
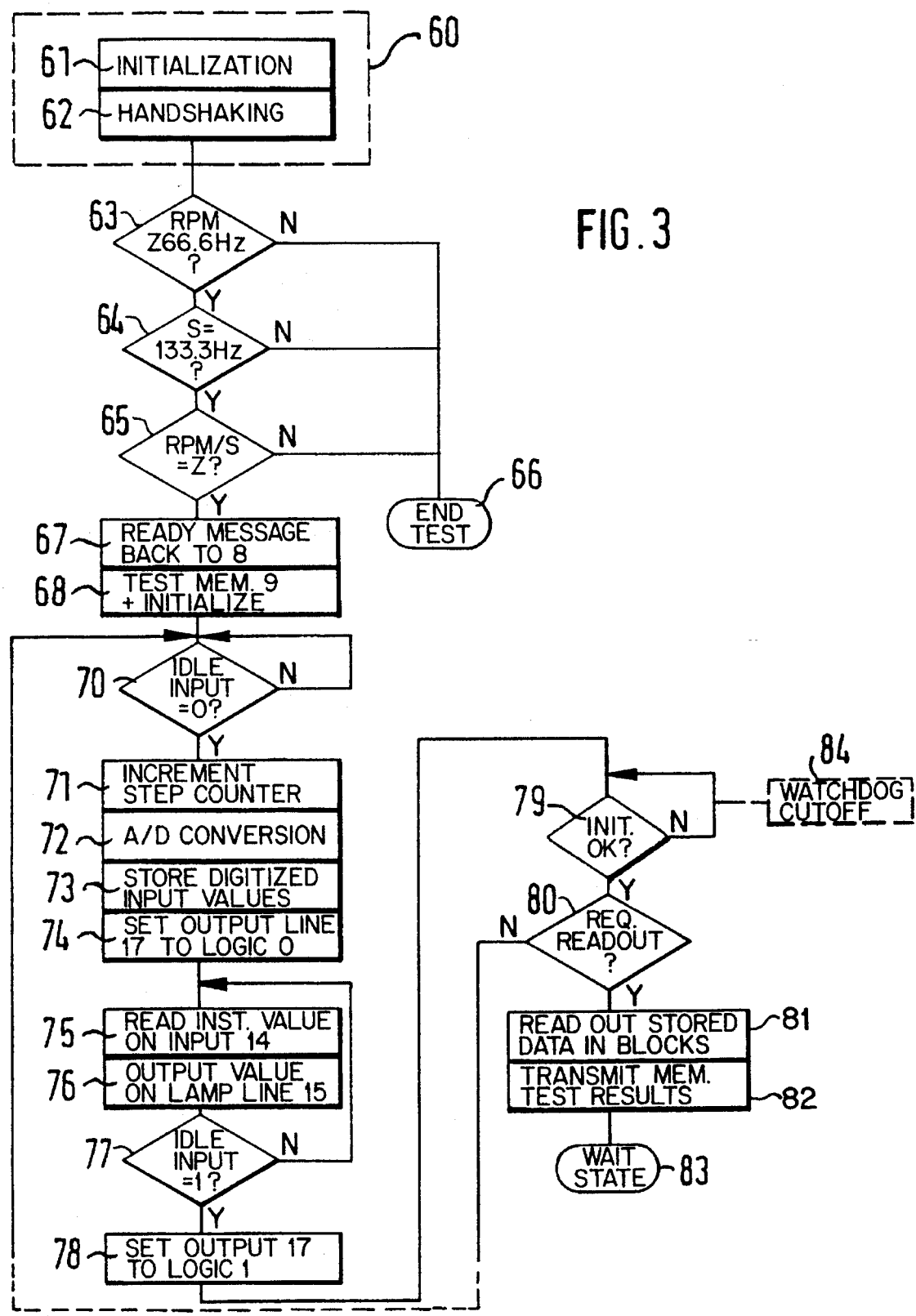
FIG. 3 shows the program structure of the test program stored in the memory of the control unit.

FIG. 3 is a flowchart of execution of the test program with reference to control unit 10. After connecting the control unit 10 to the test unit 7, a supply voltage is applied to the control unit 10 from the test unit 7. Then, the necessary self-checks and initializations are run, just like in normal operation, and then the operation program is run. Program step 61 represents these procedures.

In program step 62, the control unit 10 establishes communication with the test computer 8 via the serial bus 19. Also included is the command from the test computer 8 to retrieve the program in the control unit. Program section 60, therefore, is not part of the test program stored in the control unit 10, but serves the start-up of the control unit 10 and the initiation of the test. Tests 63 through 65 are part of the test program. They serve as checks to evaluate if entering the test program was permitted, that is, to see if the initial values, already mentioned in program step 30 of FIG. 2, have been applied by the test computer 8 to the control unit 10. Test 63, therefore, checks if a frequency of 266.6 Hz is present at the RPM input 14. If this value is not present, the test program is terminated in program step 66, and the unit returned to the operational program. If the value is present, program step 64 checks to see if a frequency of 133.3 Hz is present at the speed input. If the result of this check is negative, again the program branches off to program step 66. If the check shows a positive result, test 65 determines the ratio of the two previously checked input values and checks for a value of 2. If the RPM input does not show double the frequency, again the program branches off to step 66. Otherwise, the test program continues with program step 67. Therein, the control unit 10 sends a message of test readiness back to the test computer via the serial bus 19. In the following program step 68, the control unit 10 proceeds with a check of memory 9 of the control unit 10 and a necessary initialization. Thereafter, the results of this memory check are stored in the volatile section 5 of the memory 9 of the control unit 10.

In the course of the initialization, among other things, memory 9 is newly organized and certain control variables are set. During memory organization, especially the area of the cascade memory is set from the address area in the operational program to another area in the volatile memory. As control variable, a memory field not used by the operation program can be filled with a certain value, for instance 5A Hex. Furthermore, a variable for a test step counter is set to zero.

In program step 70, a query checks to see if logic Zero is present at the idle contact input. If this is the case, the test program recognizes that the test computer 8 is initiating the first program step. If this value is not yet present at the idle contact input, the control unit repeats the query 70. This creates a program loop that the control unit 10 continues to process until the test computer 8 requests the first test step via the idle contact line 18. For processing the test step, program step 71 then first increments the test step counter. The control unit processes the data applied to the inputs. These are being applied by the test computer 8 and have been declared as valid by setting the idle contact input 18 to logic Zero. Processing of these applied data occurs through the input circuits of the control unit 10.

In this process, no program portions and/or data of the operation program are being used. It is only determined by the set-up of the control unit. Since analog signals are used also, they are first converted using an A/D converter. This is done in program step 72. In program step 73, the data processed in the input circuits, now all in digital format, are stored in memory 9.

For a later determination of the correlation between these data and the respective test step, the position of the test step counter is also stored in the memory 9. After this program step, the ignition signal output line 17 is set to logic Zero by the control unit 10. This is done in program step 74. It signals to the test computer that the applied input data have been processed. In program step 75, the current value of the RPM input line 14 is read in and read out directly to the diagnosis lamp output line 15 in program step 76. Other input/output line combinations could be used also, like speed input and throttle output line. These two program steps are processed in a loop until a logic One condition is recognized on the idle contact input line 18. In program step 78, the ignition signal output line 17 is then set to logic One, indicating to the test computer 8 the end of a test step. Before further test steps are being processed, test step 79 checks if the test has been initialized correctly. This is done by comparing the control variable and the value of the cascade indicator, set in test step 68, with values set at initialization. The purpose of this step is to recognize an unwanted start of the test, due to, for instance, EMF (Elector-Motive Force) noise or disturbances. This serves to protect the operation and the engine, because controlling the outputs, especially the ignition signal output line 17, can have negative effects on the engine.

If the test has not been initialized correctly, test 79 is repeated. This creates a continuous loop that is terminated after a short time (for instance 15 milliseconds) by a watch-dog circuit (program step 84). If the test was initialized correctly, the control unit 10 checks in step 80 whether a command from the test computer 8 for an output of the data stored during the test step is present. This command is sent by the test computer 8 at the end of all test steps via serial bus 19 through transfer of a command block. If this command is not present, program steps 70 through 80 are repeated.

After the command for data release, the data are transferred to the test computer in program steps 81 and 82 via the serial bus 19. During step 81 of this process, the input data, stored in memory 9 during the individual test steps, are transferred in blocks together with the corresponding test step count. Each block contains the measurement data of one test step. In program step 82, the result of the memory check of program step 67 is transferred in one block to the test computer 8. After the data transfer, the control unit is placed in a stand-by mode in control step 83. This stand-by mode continues until the supply voltage is cut off by the test computer 8.

FIG. 4 shows the control of a test step using the simulation and measuring unit 10. Therein, signal 24 is transmitted to the control unit 10 by the test computer 8 via the idle contact input line 18. Signal 25 is transmitted to the test computer 8 by the control unit 10 via the ignition signal output line. A test step is initiated by the test computer applying certain signals to the input terminals of the control unit. This has been explained in program step 32. During the time $t_E$, the test computer 8 allows the signals to stabilize.

At the end of time $t_E$, the test computer applies logic Zero to the idle contact input line. This edge signal is recognized by the control unit 10. The control unit 10 sees this event a command to process the signals present at the inputs. During the time $t_L$, the control unit 10 processes these signals as described in program steps 72 and 73. Thereafter, the control unit, in turn, sets the ignition signal output line 17 from logic One to logic Zero. This edge signal 21, in turn, is recognized by the test computer 8, which then applies certain square wave signals to certain inputs.

The square wave signals are applied during time period $t_D$, and are processed by the control unit 10 as described in program steps 75 and 76, and are also processed by the test computer 8, as described in program steps 37 through 41. At the end of time period $t_D$, the test computer will set the idle contact input line from logic Zero to logic One as shown in ramp signal 22. This signifies the end of the test step.

After recognition of this edge signal 22, the control unit, in turn, sets the ignition signal output line 17 from logic Zero to logic One. Edge or ramp signal 23 is delayed by the time period $t_V$ because of the processing time in the control unit 10. These steps are repeated for the individual test steps. Since the time period $t_E$ can be set by the test computer 8, this process also allows for input measurements of dynamic signals. This is done by applying the same input signals to the control unit in several test steps, and by successively increasing the time period between the time of the signal application and the signal validation.

The time-dependent behavior of these signals is then stored in memory 9 of the control unit 10. The time-dependent behavior can only be demonstrated in a limited fashion because of the size of the volatile memory 9 in the control unit 10.

FIG. 5 shows the evaluation of the applied and read out square wave signals. Signal 90 shows a possible square wave signal for a test step at the input of the control unit. Signal 91 shows the processed result of this square wave signal, which is applied to the test computer via a certain output line. The individual ramps of signal 91 are delayed in relation to the ramps of signal 90 by time periods $\Delta t_1$ to $\Delta t_4$ because of the processing times in the control unit 10. The delay times $\Delta t_1$ to $\Delta t_4$ should be approximately 22 microseconds under normal conditions. If they are longer than 41 ms, proper operation of the control unit is no longer possible, and the control unit is declared bad, and shunted out of the production line to a "reject collection point." It is also possible to experience changes in the shape of signal 91 when compared to signal 90. Measurement comparisons of the power-down surges 93 and 96 as well as the saturation voltages 92, 94, and 95 in comparison to signal 90 offer an indication of the quality of the output circuits of the control unit.

Various changes and modifications are possible within the scope of the inventive concept.

We claim:

1. Method of testing a control unit (10), for control of an internal combustion engine, using an operational program and a test program, wherein the test program, in which adjustable simulated measurement values are applied to at least one of inputs and outputs of the control unit to test said unit, and resulting signals output by the control unit are then transferred to an external test system (7) where they are checked for validity, comprises the steps of:
   (i) applying (14, 16) said simulated measurement values to said control unit (10);
   (ii) confirming, to the control unit (10), the validity of the applied measurement values by generating an edge signal (20) only at a predetermined input line (18) of the control unit (10);
   (iii) processing (70–78) said applied measurement values in said control unit (10), and storing results of said processing in a memory (9);
   (iv) confirming, to said external test system (7), completion of said processing in said control unit, by generating a further edge signal only at a predetermined output line (17) of said control unit (10); and,
   (v) following completion of said processing, transmitting results of said processing via a serial bus (19) to said external test system, which test system (7) checks said results for correctness; and
   wherein the operational program, which is used during normal operation of the control unit, comprises the steps of:
   (i) detecting operating parameters with the predetermined input line; and
   (ii) outputting control signals with the predetermined output line.

2. Method according to claim 1, wherein
the process results stored in memory (9) are transferred to the test system at the end of the test.

3. Method according to claim 1, wherein
the measurement data in the control unit (10) are processed by a test program stored in the control unit (10).

4. Method according to claim 1, wherein
the test program verifies the operation of the memory (9) of the control unit and stores the test results in the memory (9).

5. Method according to claim 1, wherein
the control unit is initialized (67) at the beginning of the test;

the test program stores certain data in a free area of the memory (9) of the control unit and/or in certain registers of the control unit, and wherein during the process of the test, the test program verifies the contents of said memory area and/or register and wherein the program is terminated if the data in said memory area and/or register are found to be invalid.

6. Method of testing a combustion engine control unit (10) using an external testing unit (7), comprising the steps of:

carrying out said testing as a series of individual steps;

applying, during one of said individual steps, a regularly varying linear alternating signal (13) to at least one input line (14) of the control unit (10);

successively:
   sampling said alternating signal by said control unit,
   processing said sampled alternating signal by said control unit, and
   immediately generating an output signal (15) by said control unit, having a level according to each sampling result on a preselected output line of said control unit; and evaluating in said external testing unit (7) time behavior (91–96) of said output signal (15) in relation to said alternating signal (13, 90) on said preselected input line (14).

7. Method according to claim 6, wherein
under control by a subprogram of the test program, the alternating signal, present at at least one input (14) of the control unit (10), and the read-out of the result are called up at certain times and processed by the control unit (10).

8. Test unit (7) for testing an automotive control unit (10), comprising:

a controllable simulation and measuring unit (11) for generating simulated measurement signals for application to said control unit (10) and for acquiring output signals from said control unit;

a serial data transmission interface (15, 16, 17) for exchange of data to and from the control unit (10), means in said test unit (7) for confirming to said control unit (10) the validity of said simulated measurement signals by generating a first edge signal (20) only at a predetermined output (18) of said test unit (7), with the predetermined input line (18) during normal operation of the control unit serving to detect operating parameters, and means in said control unit (10) for confirming to said test unit (7) correct processing of the measurement data by generating a further edge signal (21) only at a predetermined output (17) of the control unit (10) which is connected to an input of the test unit (7), with the predetermined output line (17) during normal operation of the control unit serving to output control signals.

9. Test unit according to claim 8, wherein the data transfer between the control unit and the test computer takes place via serial bus interface (19).

10. Test unit according to claim 8, wherein upon the appearance of said further edge signal, a next set of measurement data is applied, and is confirmed to be valid by a repeated generation of the first edge signal.

11. Test unit according to claim 10, wherein a counter, which contains the number of measurement data read out, is incremented before read-out of the measurement data.

12. Test unit according to claim 11, wherein, after a certain value is reached by the counter, the processed results are demanded from the control unit.

13. Test unit according to claim 11, wherein a counter in the control unit is also incremented before processing of the applied measurement data, and wherein the count is stored in the memory (9) together with the corresponding processed results.

14. Test unit according to claim 13, wherein, controlled by the test computer, at the end of the test, the process results, together with the corresponding counts, are transferred to the test computer and compared to the nominal or command values for each count.

15. Test unit according to claim 14, wherein results of an operability test of said memory (9) of said control unit (10) are transmitted to said test computer, and evaluated in said test computer (8).

* * * * *